United States Patent [19]
Becker-Irvin

[11] Patent Number: 5,914,606
[45] Date of Patent: Jun. 22, 1999

[54] BATTERY CELL VOLTAGE MONITOR AND METHOD

[76] Inventor: Craig H. Becker-Irvin, 143 Via La Circula, Redondo Beach, Calif. 90277

[21] Appl. No.: 08/728,221

[22] Filed: Oct. 10, 1996

[51] Int. Cl.$^6$ .................................................... G01R 27/26
[52] U.S. Cl. .......................... 324/434; 340/636; 324/663; 320/116
[58] Field of Search ..................................... 324/434, 433, 324/427, 429, 663; 340/636; 320/116

[56] References Cited

U.S. PATENT DOCUMENTS

| | | | |
|---|---|---|---|
| 5,099,211 | 3/1992 | Nowak | 324/434 |
| 5,710,503 | 1/1998 | Sideris | 324/434 |
| 5,760,587 | 6/1998 | Harvey | 324/434 |
| 5,805,068 | 8/1998 | Bradus | 324/434 |

*Primary Examiner*—Maura Regan
*Attorney, Agent, or Firm*—Terje Gudmestad; Georgann Grunebach; Michael W. Sales

[57] ABSTRACT

A circuit and method are presented for making differential voltage measurements when one or both measurement points are at voltages that exceed those allowed by a typical differential amplifier, and is particular useful for monitoring the individual cell voltages of a number of series-connected cells that make up a rechargeable battery in which some cell voltages must be measured in the presence of a high common mode voltage. Each measurement point is connected to an input of a respective voltage divider, with all the divider outputs connected to a multiplexer having two outputs. The two multiplexer outputs are connected to a differential amplifier. When the voltage dividers are "closely matched," the output of the differential amplifier is directly proportional to the differential voltage between the pair of points to which the dividers are connected, and the differential voltage between those two points is accurately determined. The voltage dividers divide down the voltage of each measurement point so that each is low enough to be input to a conventional differential amplifier. By selecting the "ratio" of each voltage divider, the circuit can be used to measure differential voltages in the presence of almost any common mode voltage. The invention requires a single differential amplifier powered by a conventional dual power supply.

21 Claims, 4 Drawing Sheets

BATTERY CELL VOLTAGE MONITOR AND METHOD

BACKGROUND OF THE INVENTION

1. Field of the Invention

This invention relates to differential voltage measurement circuits, and more specifically to measurement circuits and methods for monitoring the voltage of a number of battery cells.

2. Description of the Related Art

A battery is typically comprised of a number of individual cells that are connected in series to produce an overall battery voltage. Some battery types, such as nickel-cadmium or nickel-hydrogen, are rechargeable. When maintaining such a battery, several problems may occur that irreversibly damage the battery or reduce its output or lifespan. For example, overcharging the battery can cause fluids within the individual cells to boil away, reducing their life and output capability.

One procedure commonly performed on rechargeable batteries is called "reconditioning." When reconditioning a rechargeable battery, each of the individual cells is intentionally discharged. While discharging, it is important to monitor the cell voltage. When any one of the cells is almost completely discharged, the discharging procedure must be stopped to prevent the voltage across the drained cell from reversing and irreversibly damaging the cell. Such a cell no longer contributes to the output of the battery and can act as a resistor among the remaining cells, thus reducing their performance.

To avoid these problems, it is advantageous to monitor the voltage across each battery cell as the battery is being recharged or discharged. This cell voltage monitoring has problems of its own, however. With a 60 cell battery, for example, with each cell producing a maximum voltage of 1.6 volts, total battery output is a maximum of 96 volts. Since the voltage of each individual cell must be monitored, a differential voltage measurement is called for. In this example, the voltage on the anode (positive terminal) of the cell at the top of the stack will be at 96 volts, and the voltage on the cathode (negative terminal) of that cell will be at 96−1.6=94.4 volts. This differential voltage cannot be measured directly with a conventional differential amplifier because both inputs exceed present amplifiers' maximum allowable input voltage specification, and the common-mode voltage (94.4 volts) exceeds the maximum common-mode voltage specification. These specifications are typically expressed in relation to the amplifier's supply voltage. Assume a differential amplifier receives a supply voltage of ±18 volts, a typical maximum. The amplifier's maximum allowable input voltage will be equal to about ±16.5 volts, and the maximum allowable common-mode voltage will be about ±12 volts. With one input at 94.4 volts and one at 96 volts, both the maximum allowable input voltage and the common-mode voltage specifications are exceeded.

One circuit that has been employed to independently measure 32 cell voltages is shown in FIG. 1. A group of eight series-connected cells 10 are connected to a voltage-to-current converter A1 (implemented with an operational amplifier), through a set of analog switches 14, such that converter A1 is connected across one cell at a time, and sequences through each of the cells 1–8. The converter A1 transforms the differential cell voltage into a ground-referenced current which is proportional to the cell voltage. The eight cells 10 each produce a maximum voltage of 1.6 volts, so that the cathode 16 of CELL 1 is at ground potential and the anode 18 of CELL 8 is at 12.8 volts. The converter A1 receives power supply voltages +PS1 and −PS1 from a floating power supply PS1 needed to provide adequate input voltage and common-mode voltage ranges. To measure each of the eight cell voltages independently, pairs of switches 14 are sequentially closed so that each cell is connected to the converter A1 in turn.

Similarly, the next series 20 of eight cells and their corresponding analog switches 22 are connected to another voltage to current converter A2, which must accommodate input voltages ranging from 12.8 to 25.6 volts. The voltage to current converter A2 receives power supply voltages +PS2 and −PS2 from a floating power supply PS2 for this range of input voltages. The remaining cells are handled the same way, with additional converters A3 and A4 requiring separate floating power supplies PS3 and PS4, respectively. The outputs of the four converters A1, A2, A3, and A4 are multiplexed together and fed to an output amplifier A5, which converts the ground-referenced current signal produced by each converter A1–A4 to a ground-referenced voltage.

This circuit, requiring four floating power supplies and four voltage to current converters, is costly and complex. The output transistors used by converters A1–A4 become electrically stressed for battery voltages greater than about 60 volts. This limitation renders the circuit impractical for batteries producing higher voltages.

Multiple cell rechargeable batteries have become increasingly prevalent in applications such as satellites and electric vehicles. Maximum voltage requirements are increasing for these and similar applications, and recharging parameters are becoming stricter as the demand for more powerful and longer-lasting batteries increases. A strong need exists for a way to accurately monitor individual battery cell voltages, and more generally, for a way to measure a number of differential voltages when one or more measurement points are at a high voltage.

SUMMARY OF THE INVENTION

A simple, low cost circuit and method are presented for making differential voltage measurements when one or both measurement points are at voltages that exceed those allowed by a typical differential amplifier. The circuit is particularly useful for monitoring the cell voltages of a number of series-connected cells that make up a rechargeable battery, in which some cell voltages must be measured in the presence of a high common mode voltage.

To make a differential voltage measurement between a pair of measurement points, each measurement point is connected to an input of a respective voltage divider, with the divider outputs multiplexed together. The multiplexer has two outputs that can be switched so that each multiplexer output is connected to one divider output (and in turn to one measurement point). The two multiplexer outputs are preferably connected to a differential amplifier. When the voltage dividers are closely matched, the output of the differential amplifier is directly proportional to the differential voltage between the pair of points to which the dividers are connected, and the differential voltage between those two points can be accurately determined. The voltage of each measurement point, each voltage divider output, and the differential amplifier output are all referenced to a common reference potential.

The voltage dividers divide down the voltage of each measurement point so that they are low enough to be input to a differential amplifier having, for example, a conventional ±15 volt supply voltage. By selecting the "ratio" of each voltage divider, i.e., the voltage out of the divider divided by the voltage into the divider, the circuit can be used to measure differential voltages in the presence of almost any common mode voltage. For example, assume one measurement point is at 999 volts and one is at 1000 volts. Each point is connected to a respective voltage divider having a ratio of 1/100, producing outputs from the dividers of 9.99 volts and 10.0 volts. The dividers bring the two measurement points within an amplifier's allowable input voltage range specification, and also within its allowable common-mode voltage specification.

The invention uses voltage dividers that are closely matched, i.e., they have division ratios that are preferably within ±100 parts per million of each other. This insures that each measurement point is scaled approximately equally. If the dividers are matched, the differential amplifier's output is directly proportional to the differential voltage between the two points, which can be accurately determined if the ratio of the dividers is known.

The invention requires a single differential amplifier powered by a conventional dual-output power supply. The voltage dividers are preferably made from precision resistors that have a low thermal coefficient of resistance and provide a very precise ratio.

An alternative embodiment places a switching network between the cells and the dividers. This arrangement requires a more complex switching arrangement, but only requires two voltage dividers, regardless of the number of battery cells to be measured.

Further features and advantages of the invention will be apparent to those skilled in the art from the following detailed description, taken together with the accompanying drawings.

DETAILED DESCRIPTION OF THE INVENTION

Figure 1:
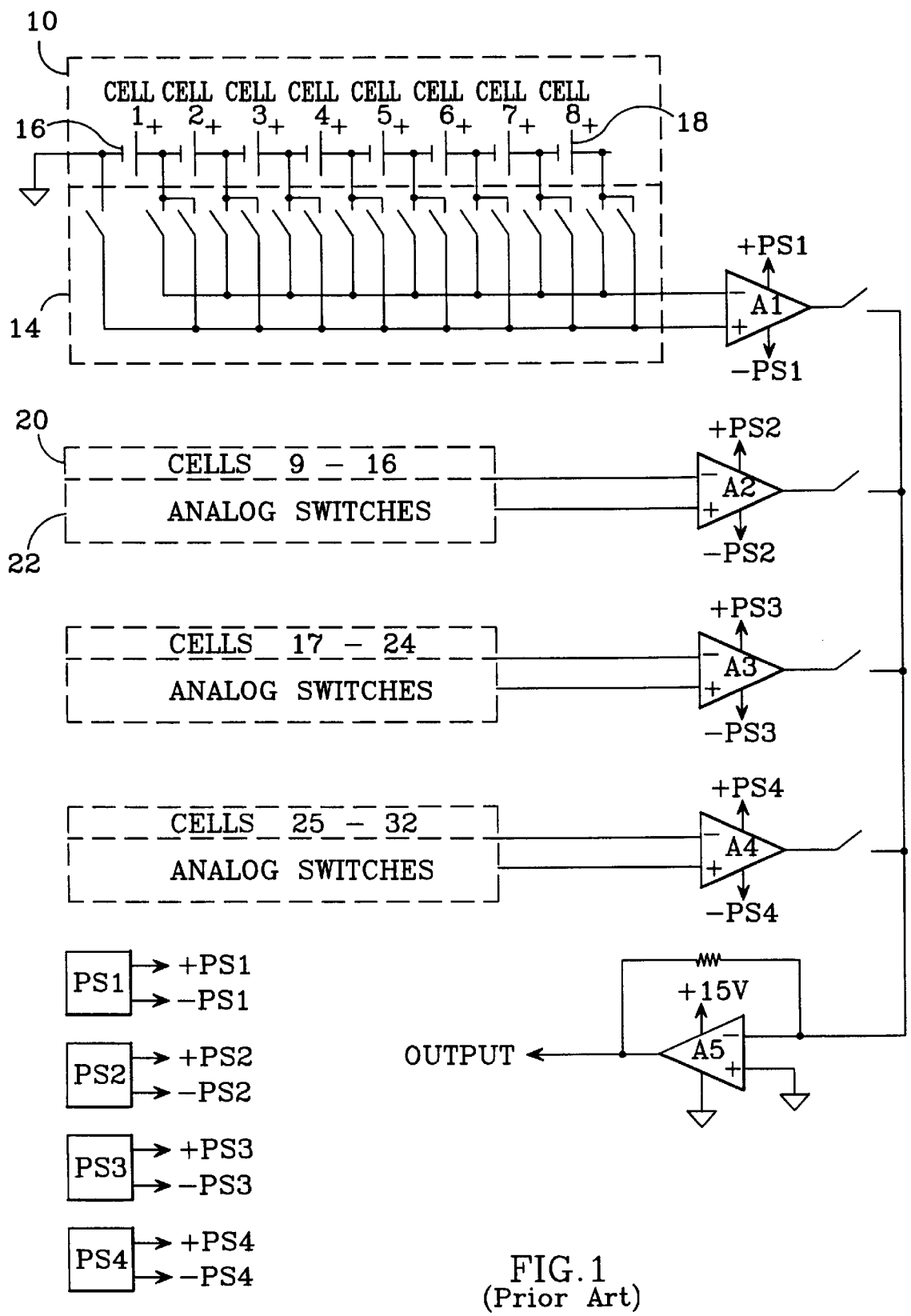
FIG. 1 is a schematic of a prior art circuit used for monitoring cell voltages.
Figure 2:
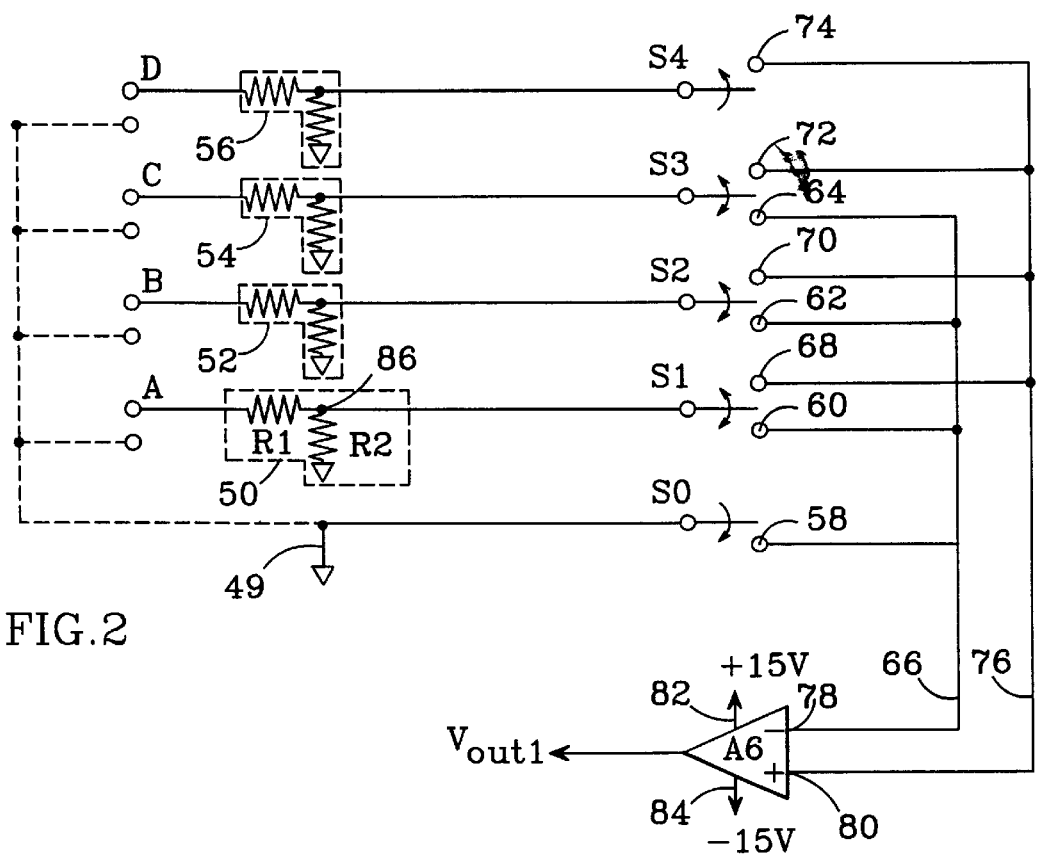
FIG. 2 is a schematic illustrating the basic principles of the invention.

The basic principles of the invention are illustrated in FIG. 2. Measurement points A, B, C, and D are each at a particular voltage potential with respect to a common reference potential 49, typically ground. Each of the four points A, B, C and D is connected to the input of a respective voltage divider 50, 52, 54 and 56. Each divider produces an output that is equal to the voltage at its input multiplied by a certain fractional ratio, with the divider output referenced to the same reference potential 49 as measurement points A, B, C and D. Thus, each divider has a ratio, defined herein as the divider's output voltage divided by its input voltage. The common reference potential 49 is preferably connected to an input terminal of a switch S0, and the outputs of dividers 50, 52, 54, and 56 are each connected to an input terminal of respective switches S1, S2, S3 and S4; S1, S2 and S3 are double-pole switches which each have lower and upper output terminals. Output terminal 58 of switch S0 and lower output terminals 60, 62 and 64 of switches S1, S2 and S3, respectively, are tied together to form one signal output 66. Upper output terminals 68, 70 and 72 of switches S1, S2 and S3, respectively, and output terminal 74 of switch S4 are tied together to form a second signal output 76. Two switches are closed at a time, with the others kept open. The differential voltage between the two signal outputs 66 and 76 is equal to the differential voltage between the two selected dividers (or between a selected divider and ground, if S0 is closed), which is proportional to the differential voltage between the measurement points connected to the selected dividers.

Signal outputs 66 and 76 are preferably connected to the inverting input 78 and non-inverting input 80, respectively, of differential amplifier A6, so that the differential voltage between the outputs can be measured. Differential amplifier A6 preferably receives a conventional ±15 volts at supply voltage pins 82 and 84.

To measure the differential voltage between point B and point A, switch S1 is closed in its up position, which connects its input terminal to its output terminal 68, and S2 is closed in its down position. Switches S0, S3 and S4 are kept open. This connects the two inputs 78, 80 of differential amplifier A6 to points B and A, respectively, via voltage dividers 52 and 50. A6 then produces an output, $V_{out1}$, that is proportional to the differential voltage between points B and A.

To determine the differential voltage between points B and A, it is essential that voltage dividers 52 and 50 be closely matched. This means that the respective ratios of dividers 50 and 52 must be nearly equal, preferably within ±100 parts per million.

To illustrate the necessity of using matched dividers, assume divider 50 has a ratio of 1/10, and divider 52 has a ratio of 1/5. Further assume that point A is at 20 volts, producing an output from divider 50 of 20 volts×1/10=2 volts, and point B is at 5 volts, producing an output from divider 52 of 5 volts×1/5=1 volt. Differential amplifier A6 then produces an output, $V_{out1}$, equal to 2−1=1 volt (assuming A6 has a gain of 1). However, this output is also obtained if point A is at 40 volts and point B is at 15 volts. Thus, neither the voltage of either measurement point, nor the differential voltage between them, can be definitively ascertained if the ratios of the dividers involved in the measurement are not matched.

If both ratios involved in a measurement are nearly equal, the differential voltage between measurement points is easily determined. The differential voltage measured between the outputs of the dividers connected to each point is multiplied by the inverse of the common ratio. For example, if both ratios are about 1/10, and the differential voltage between the dividers' respective outputs is 0.5 volts, the differential voltage between the measurement points is equal to about 0.5×10, or 5 volts.

Similarly, to measure the differential voltage between point C and point B, connected to dividers 54 and 52 respectively, switch S2 is closed in its up position and S3 is closed in its down position, with the other switches kept open. The output of A6, $V_{out1}$, will be directly proportional to the differential voltage between points C and B, which is easily determined if the ratios of dividers 54 and 52 are known and closely matched. If all the dividers 50, 52, 54 and 56 are closely matched, this circuit can be used to measure the differential voltage between any two of the four points by simply closing the appropriate switches; this concept is, of course, extendable to any number of measurement points that are referenced to the same common reference potential.

Another significant advantage provided by the use of voltage dividers is that they make it possible to perform differential voltage measurements in the presence of a high common mode voltage, and/or when at least one of the measurement points exceeds the differential amplifier's maximum input voltage. For example, assume point A is at 80 volts and point B is at 85 volts, both with respect to the reference potential 49. Both points are likely to exceed the allowable input voltage range specification of differential amplifier A6, and the common-mode voltage of 80 volts is also well above typical maximum allowable common-mode voltage specifications. However, points A and B can be at nearly any voltage potential as long as the potentials are divided down with dividers having appropriate ratios, so that the divider outputs will be within the allowable input voltage and common-mode specifications of the differential amplifier used. For this example, if point A and point B are each connected to a divider providing a ratio of 1/10, then differential amplifier A6 will see inputs of 8.5 volts and 8.0 volts, well within its allowable input range if the amplifier is powered with a conventional ±15 volt dual-output power supply, and a common-mode voltage of 8.0 volts that is also well within the amplifier's allowable range.

The dividers are preferably comprised of two resistors arranged in the standard voltage divider configuration. As shown in FIG. 2 for divider 50, one lead of a first resistor, R1, serves as the input to the divider. One lead of a second resistor, R2, is connected to reference potential 49. R1 and R2 are joined at a common node 86 that serves as the output of the divider. The ratio of divider 50 is given by R2/(R1+R2). For example, a ratio of 1/10 is achieved if R1 is 9 kilohms and R2 is 1 kilohm. The ratios of dividers 52, 54 and 56 are calculated similarly.

The differential amplifier A6 has a gain, $G_1$. The output of A6, $V_{out1}$, is given by:

$$V_{out1} = G_1 \times V_{mp} \times \text{RATIO}_1 \tag{1}$$

where $V_{mp}$ is the differential voltage between the two measurement points, and $\text{RATIO}_1$ is the ratio of the closely matched dividers connected to the measurement points.

Figure 3:
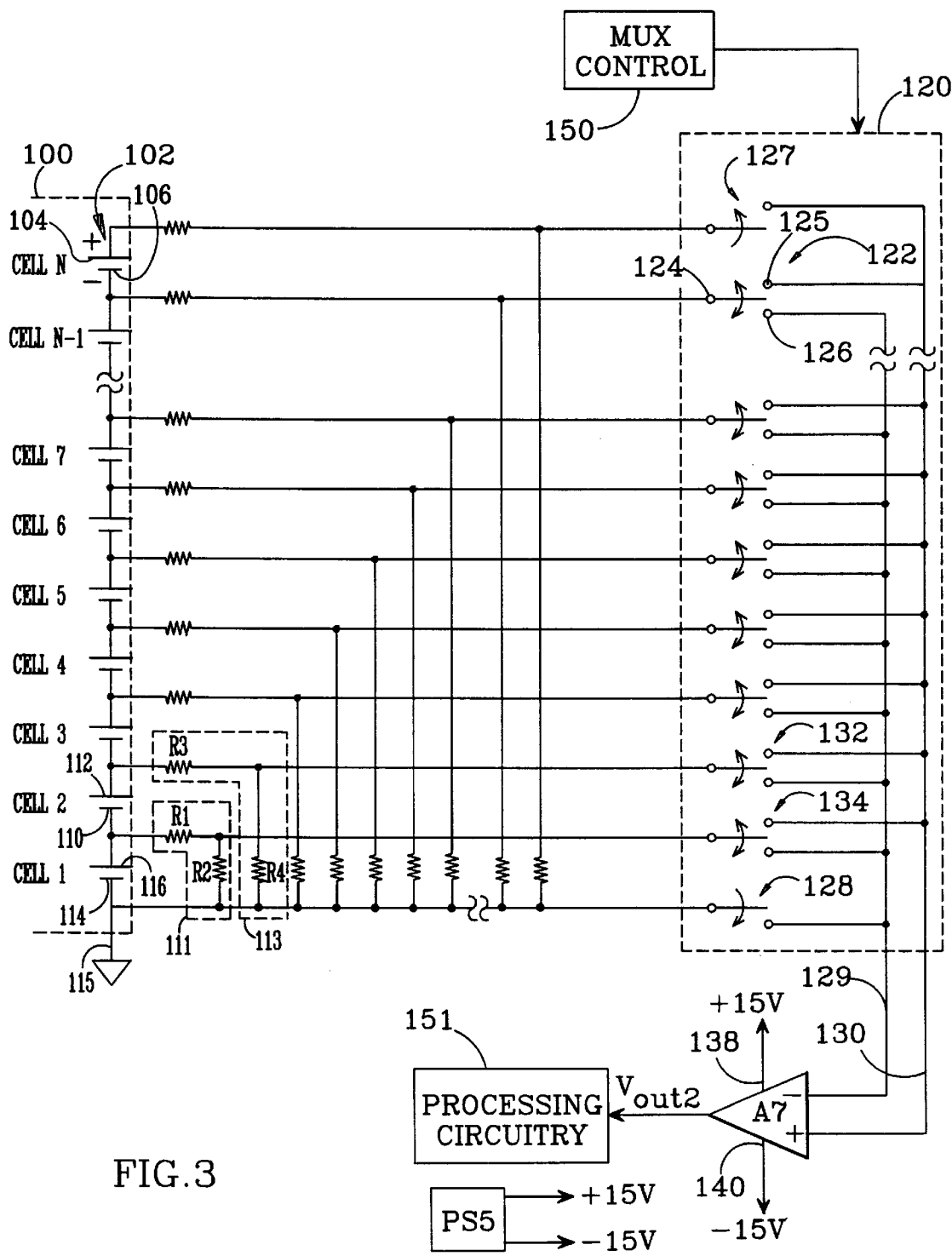
FIG. 3 is a schematic of the invention used as a battery cell voltage monitor.

A primary application of the invention is as a battery cell voltage monitor, shown in FIG. 3. A battery 100 is comprised of N cells 102, CELL 1 to CELL N, that are series-connected to produce an overall battery voltage. Each of the cells 102 has an anode 104 and a cathode 106. When such a battery is rechargeable, it is usually recharged by supplying a constant current through the entire battery. This is because, typically, the individual cells are not accessible, and in any event could not be recharged individually without disconnecting each cell from the others. When being reconditioned, the entire battery or portions of the battery are intentionally discharged. It is advantageous to monitor the voltage of each individual cell as it is being recharged or intentionally discharged, to prevent problems such as overcharging and overdischarging, as discussed above.

The voltage across each individual cell is measured via the use of a pair of closely matched voltage dividers, except in the case of CELL 1, discussed below. For example, to measure the cell voltage of CELL 2, the cathode 110 of CELL 2 (connected to the anode of CELL 1) is connected to the input of a first voltage divider 111. Similarly, the anode 112 of CELL 2 (connected to the cathode of CELL 3) is connected to a second voltage divider 113.

An individual cell voltage is measured in the same manner as that discussed above. The cell voltage of CELL 2 is determined by measuring the differential voltage between the output of divider 111 and the output of divider 113, as long as the ratios of the two dividers are closely matched. The outputs of the two dividers are connected via switches to a differential amplifier, discussed below.

CELL 1 is handled slightly differently because its cathode 114 is connected to a reference potential 115, typically ground. The anode 116 of CELL 1 is connected to the input of divider 111. To measure the cell voltage across CELL 1, the output of divider 111 and the reference potential 115 are connected via switches to a differential amplifier.

It is not essential that any of the measurement points be at ground potential. It is only necessary that all of the pairs of points to be measured are referenced to one common reference potential, referred to herein as the reference potential 115, and that the dividers be referenced to that same potential. When these conditions are met, the output of the differential amplifier will be referenced to the reference potential as well.

A switching network is used to enable the measurement of each individual cell voltage, preferably comprising analog switches configured as a multiplexer 120. The switches 122 are preferably double-pole (with two exceptions, discussed below), with each switch having an input 124, an upper output 125 and a lower output 126; a switch can be open, or can be closed to its upper or lower output, which connects its input 124 to its corresponding output 125 or 126. Each voltage divider is connected to the input of a respective double-pole switch. The exceptions are switch 127, whose input is connected to the divider that is connected to the anode of CELL N and switch 128, which is connected to the cathode of CELL 1—these switches may be single-pole. The outputs of half of the switches are then tied together to form the first output 129 of the multiplexer, and the other half of the switches are tied together to form the second multiplexer output 130. By appropriately closing two multiplexer switches (and having all the other switches open), two voltage divider outputs are available at the multiplexer outputs, and thus the differential voltage between the two measurement points to which the dividers are connected can be measured. The multiplexer is controlled such that pairs of measurement points, in which the two points are on either side of a cell, are sequentially made available at the multiplexer outputs (via the dividers), so that each cell voltage can be independently measured. For example, to measure the cell voltage of CELL 2, switch 132 is closed in the up position and switch 134 is closed in the down position, with all the other switches open. Closing switch 132 in the up position makes the output of voltage divider 113, which is connected to the anode 112 of CELL 2, available at multiplexer output 130, and closing switch 134 in the down position makes the output of voltage divider 111 available at multiplexer output 129.

To measure the differential voltage between the two multiplexer outputs 129, 130, the outputs are preferably connected to a differential amplifier A7. A7 will have some gain, $G_2$. The output of A7, $V_{out2}$, is given by:

$$V_{out2} = G_2 \times V_{cell} \times \text{RATIO}_2 \tag{2}$$

where $V_{cell}$ is the voltage across the cell being monitored, and $\text{RATIO}_2$ is the ratio of the closely matched dividers connected to either side of the cell. $\text{RATIO}_2$ is given by $R_x/(R_x+R_y)$, in which $R_x$ is the resistor connected to the measurement point and $R_y$ is the resistor connected to the reference potential. A7 preferably receives a ±15 volt supply voltage at its supply pins 138 and 140, supplied by a single dual-output power supply PS5.

The ratio of the dividers is chosen so that the maximum input voltage and common-mode voltage specifications of differential amplifier A7 are not exceeded with any expected measurement. For example, assume differential amplifier A7 receives a ±15 volt supply voltage at its supply pins 138 and 140, and A7's specifications allow a maximum input voltage of ±13.5 volts and a maximum common-mode voltage of ±10 volts. Further assume that the highest measurement point voltage that will be encountered is 300 volts, and the highest common-mode voltage that will be encountered is 295 volts. Using dividers that each provide about a 1/30 ratio will divide the 300 volt point down to about 10 volts, and the highest common-mode voltage down to about 9.83 volts. These values are within the specifications of A7 and thus the differential measurement can be accurately made.

The output of differential amplifier A7, $V_{out2}$, is related to the cell voltage by Equation 2 above. This output can be connected to a computer or other processing circuitry 151 in order to control the recharging or discharging of the battery 100. Assume that the appropriate multiplexer switches can be closed and a measurement taken every 30 ms, which is readily achievable using ordinary circuit design techniques. If there are 60 cells, each one will be monitored approximately once every two seconds. This is sufficiently quick to detect the approach of overcharging, overdischarging, or other conditions that may occur during recharge or discharge.

Figure 4:
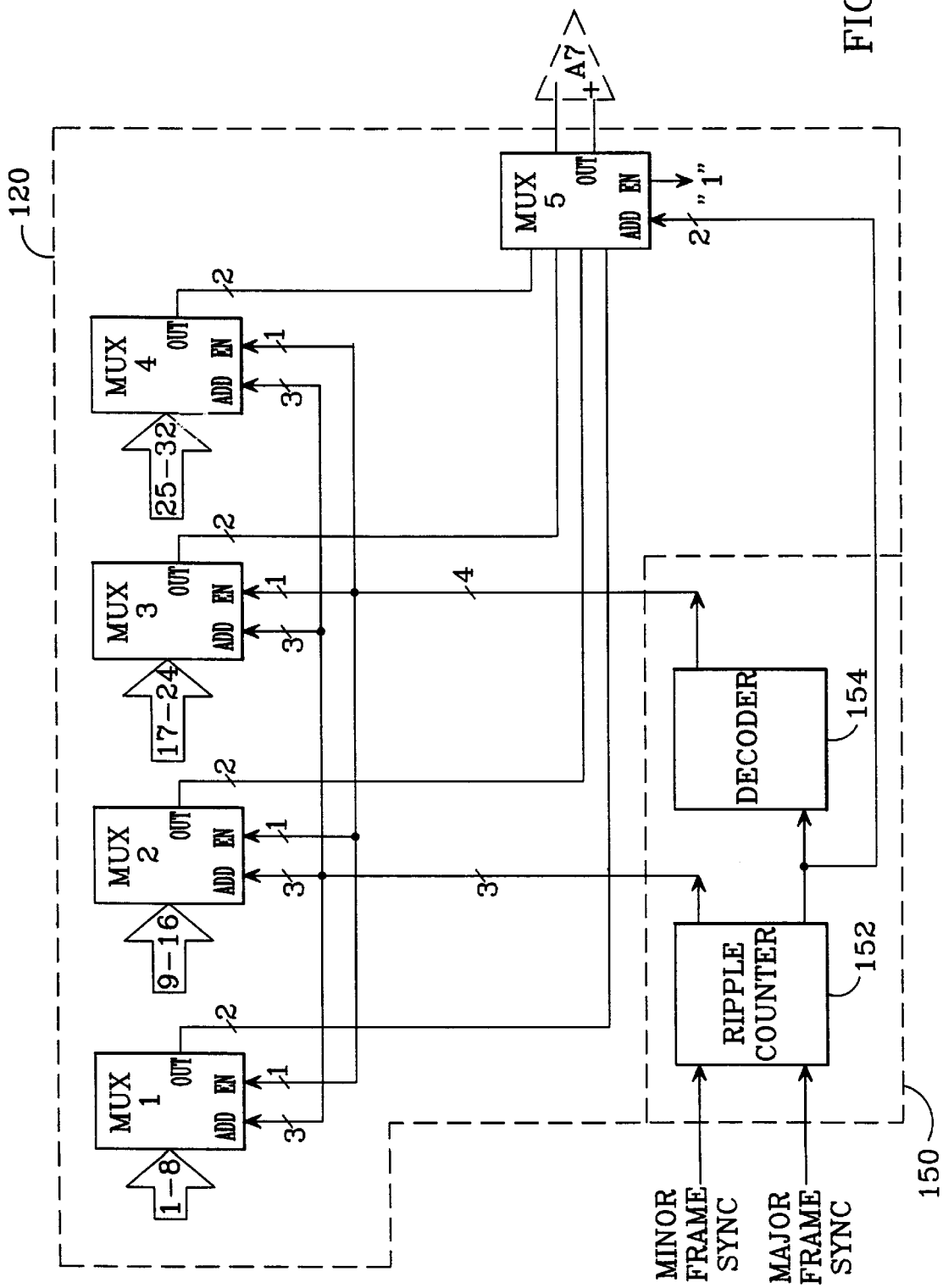
FIG. 4 is a block diagram of a portion of the battery cell voltage monitor shown in FIG. 3.

To make differential voltage measurements across each cell individually, a multiplexer control circuit 150 is used. A block diagram of a preferred implementation of multiplexer control circuit 150 and multiplexer 120 is shown in FIG. 4 for a 32 cell battery. Multiplexer 120 is implemented with four 8-channel differential multiplexers MUX1–MUX4. Each multiplexer has two outputs ("OUT"), and receives as inputs the outputs of eight pairs of dividers (shown as "1–8", "9–16", etc. in FIG. 4)(dividers not shown), which are in turn connected across eight battery cells (not shown). Each multiplexer also has an enable input ("EN") and a three-bit address input ("ADD"). When the multiplexer is enabled, sequencing through the eight possible addresses allows each of the eight input channels to be selectively connected to the multiplexer outputs. The outputs of the four multiplexers are connected to the inputs of a fifth multiplexer, MUX5, which is always enabled, and whose two outputs are connected to differential amplifier A7.

To control the multiplexers, a ripple counter 152 and a decoder 154 are preferably used. The ripple counter 152 receives a repetitive clock pulse ("MINOR FRAME SYNC") as one input, and a second clock pulse ("MAJOR FRAME SYNC") that pulses once for every 32 MINOR FRAME SYNC pulses. The three LSB's of the ripple counter output are connected to MUX1–MUX4, which cycles each multiplexer through its eight channels. The next two LSB's out of the counter 152 are input to the decoder 154, and to MUX5. The decoder 154 decodes the two bits into four individual outputs, to sequentially enable MUX1–MUX4. The same two bits are used to sequence MUX5 through its input channels, so that MUX1–MUX4 are sequentially connected to A7. After each cell has been sequentially connected to A7, MAJOR FRAME SYNC causes the ripple counter 152 to reset and the sequence starts over.

MUX1–MUX5 are preferably DG507AAK/883's from Siliconix, Inc., of Santa Clara, Calif. The ripple counter 152 is preferably a CD4024B, and the decoder 154 is preferably a CD4555B, both available from RCA.

The degree to which the resistor divider ratios must be matched (%MATCH) is dependent of the degree of accuracy needed for the differential voltage measurement being performed. The percent error (%ERROR) of a cell voltage measurement performed with the circuit of FIG. 3 is given by:

$$\%ERROR = (((2V_a + V_{cell}) \times \%MATCH)/V_{cell}) \times 100\% \quad (3)$$

where $V_a$ is the cathode voltage of the cell being measured (with respect to the reference potential) and $V_{cell}$ is the cell voltage. For example, if the cathode of a cell is at 95 volts, the cell voltage is 1.6 volts, and the %MATCH is ±0.01%, i.e., the ratios of the dividers involved in the measurement are equal to ±0.01%, the accuracy of the cell voltage measurement is:

$$\%ERROR = (((190+1.6) \times 0.0001)/1.6) \times 100\% = 1.1975\%$$

Note that if the %MATCH parameter is loosened up to only ±0.100%, the %ERROR jumps to 11.975%. A ratio mismatch of ±1% results in a measurement error of 119.75% for this example. Thus, closely matched divider ratios are crucial to obtaining high accuracy measurements with the invention. The dividers should also have a low thermal coefficient of resistance to minimize drift of the ratio value due to changes in temperature.

One specific application of the invention is as a battery cell voltage monitor for a rechargeable battery pack used on a satellite. Typical batteries for which the invention is applicable include nickel-cadmium or nickel-hydrogen types, though the invention is not limited to any specific rechargeable battery types. The battery pack comprises 60 individual cells, with each cell producing a maximum voltage of 1.6 volts, so that the overall maximum battery voltage is 96 volts. This application of the invention uses dividers that are made from two resistors—one of about 100 kilohms and one of about 10 kilohms, each rated for 125 mw—with both resistors housed together in one package. The dividers are designed to provide a ratio of 1/11 within a tolerance of ±0.01%. These dividers are available from Vishay Intertechnology, Inc. of Malvern, Pa., and have a thermal coefficient of resistance of ±2 ppm/degree C.

The invention will measure differential voltages between points that are at very high voltages, as long as the dividers are built to withstand the conditions that will be imposed on them. For example, measuring the voltage across a cell with a nominal cell voltage of 1.5 volts and a common mode voltage of 400 volts, can be accommodated with a divider having a ratio of 1/40. The values, tolerances and construction of the resistors used in the dividers should all be such that they can withstand the voltage and current demands placed upon them, can remain very stable over time and temperature, and can present signals to a differential amplifier that are within the amplifier's capabilities to measure. It is further recommended that the dividers be in relatively close proximity to each other or be contained within a well-controlled environment, so that ratio drifting due to temperature differences between dividers is reduced. Note that for the preferred Vishay Intertechnology, Inc. dividers discussed above, an upper voltage limit of about 400 volts should be observed. These dividers are implemented with thin film printed-circuit resistors; arcing can occur if the voltage on the divider exceeds the manufacturer's rating.

The dividers can be implemented in a number of ways besides the use of two discrete resistors. Any number of resistors can be used in combination as long as the desired ratio is achieved. Potentiometers may also be used to provide resistance, though a potentiometer may not provide the stability and precision needed for a highly accurate measurement circuit. Resistor packages, in which a number of resistors are contained within an integrated circuit package, generally lack the tight tolerances needed for this application, but could be used if less accurate measurements are acceptable.

It is important to note that it is the ratios of the dividers that must be matched, and not the resistor values themselves. As shown in Equation 3, the percentage error in a cell voltage measurement is not dependant on the actual ratio of the dividers, but rather on the common mode voltage $V_a$ and on the tolerance between dividers, %MATCH.

In addition to the implementation shown in FIG. 4, multiplexer 120 and multiplexer control circuit 150 can be implemented in many ways. Multiplexer 120 could use mechanical switches, relays, or discrete analog switches, for example. Many conventional digital logic circuits could be designed to perform the functions of multiplexer control circuit 150, to generate the signals necessary to command the multiplexer to connect its outputs to each cell sequentially, and to continuously cycle through and measure the cell voltages during a recharging or discharging procedure.

The differential amplifier A7 used to measure the voltage between the two multiplexer outputs 128 and 130, should be highly linear and have a high common mode rejection ratio. An AMP-01 instrumentation amplifier from Analog Devices, Inc. of Norwood, Mass., receiving a supply voltage of about ±15 volts, is preferred.

When using the invention as a battery cell voltage monitor and using the preferred components, an overall cell voltage measurement accuracy of 2% or less is achievable.

Figure 5:
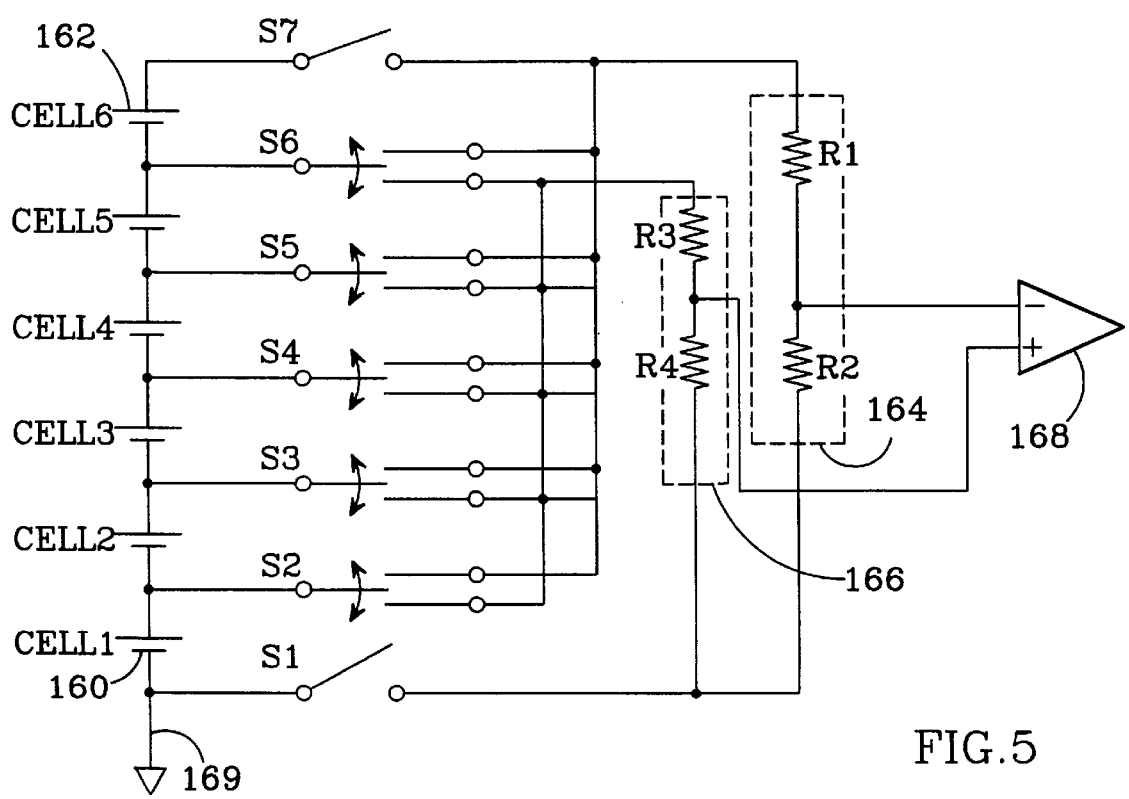
FIG. 5 is a schematic of an alternate embodiment of the invention using only two voltage dividers.

An alternative embodiment requiring only two voltage dividers is shown in FIG. 5 for a six cell battery (CELL 1–CELL 6). Each cell terminal except the cathode 160 of CELL 1 and the anode 162 of CELL 6 is connected to a common terminal of a respective double-pole double-throw switching device S2–S6; the cathode of CELL 1 and the anode of CELL 6 only require connection to a respective SPST switching device, S1 and S7. The remaining switch terminals are connected together, and to two voltage dividers 164 and 166, such that a given cell's anode can be connected to one divider 164 and the cell's cathode can be connected to the second divider 166. The outputs of the two dividers are connected to the two inputs of a differential amplifier 168. As above, the differential voltage between the two voltage divider outputs will be directly proportional to the cell voltage, if the two dividers are closely matched. By opening and closing switches in the proper sequence, all the cell voltages can be measured in turn.

To measure the cell voltage of CELL 1, for example, S1 is closed, connecting one input of amplifier 168 to a reference potential 169, and S2 is closed to connect the anode of CELL 1 to the input of divider 164. All other switches must be in their open position. To measure the cell voltage of CELL 2, S2 is closed to connect the cathode of CELL 2 to the input of divider 166, and S3 is closed to connect the anode of CELL 2 to the input of divider 164. Again, all other switches are open. The differential voltage between the outputs of divider 164 and 166 is directly proportional the cell voltage of CELL 2.

This embodiment requires a more complex switching arrangement than that shown in FIG. 3, but only requires two dividers, no matter how many cells are used. Since the dividers are subject to the tightest tolerance requirements, only needing two dividers may justify the use of the more complex switching scheme. A large reduction in the number of dividers might also justify the purchase of dividers that are even more closely matched, improving the overall accuracy of the circuit. The switching arrangement may be implemented in a number of ways, including mechanical switches, relays, analog switches, or one or more digital multiplexers.

While particular embodiments of the invention have been shown and described, numerous variations and alternate embodiments will occur to those skilled in the art. Accordingly, it is intended that the invention be limited only in terms of the appended claims.

I claim:

1. A battery cell voltage monitor suitable for measuring the voltage of any individual cell of a multi-cell battery, comprising:

a plurality of voltage dividers connectable to the anodes of respective battery cells to divide the voltages at said anodes by respective divider ratios to produce respective voltage divided outputs, each of said voltage dividers being referenced to a common reference potential, a switching network connected to switch two of said voltage divided outputs to respective complementary outputs, a switching control circuit for operating said switching network to present a sequence of voltage divided outputs to said complementary outputs representing the cell voltages of a sequence of said cells, the divider ratios of said voltage dividers being closely matched so that said voltage divided outputs represent their respective anode voltages divided by approximately the same ratio, and a differential amplifier connected to said complementary outputs and arranged to produce an output representing the differential voltage between said complementary outputs, said amplifier output referenced to said reference potential, said differential amplifier rejecting a majority of the common mode voltage presented at its inputs, said voltage dividers arranged such that their respective voltage divided outputs are each within the allowable input voltage and common mode voltage range of said differential amplifier over an expected range of battery voltages.

2. The battery cell voltage monitor of claim 1, further comprising a battery comprised of a plurality of series-connected battery cells, each cell having an anode and a cathode and a respective cell voltage across said anode and cathode, said cells producing a battery voltage with respect to said reference potential, wherein said dividers are connected to respective anodes of said cells.

3. The battery cell voltage monitor of claim 2, wherein said battery is a nickel-cadmium battery.

4. The battery cell voltage monitor of claim 2, wherein said battery is a nickel-hydrogen battery.

5. The battery cell voltage monitor of claim 2, wherein said battery has a maximum voltage of about 96 volts.

6. The battery cell voltage monitor of claim 2, wherein each cell has a maximum voltage of about 1.6 volts.

7. The battery cell voltage monitor of claim 6, wherein said differential amplifier produces an output such that the voltage of a cell being measured is determined with an error of about 2 percent or less.

8. The battery cell voltage monitor of claim 1, wherein said each of said ratios is between about 1/5 and 1/20.

9. The battery cell voltage monitor of claim 1, wherein said ratios are matched within ±100 parts per million.

10. The battery cell voltage monitor of claim 1, wherein said dividers are comprised of precision resistors.

11. The battery cell voltage monitor of claim 10, wherein each divider comprises two precision resistors that are packaged together in a single housing.

12. The battery cell voltage monitor of claim 1, wherein each divider has a temperature coefficient of resistance of about ±2 ppm/degree C.

13. The battery cell voltage monitor of claim 1, further comprising a single dual-output power supply, with no other supply voltages needed.

14. A differential voltage measurement circuit for measuring the differential voltage of one or more pairs of measurement points, comprising:
   a plurality of voltage dividers connectable to a plurality of respective measurement points, each of said voltage dividers having respective divider ratios and referenced to a common reference potential, said dividers dividing the voltages at respective ones of said measurement points by respective divider ratios to produce respective voltage divided outputs, wherein the differential voltage measured between two voltage divided outputs is directly proportional to the differential voltage between their respective measurement points, said voltage dividers arranged such that their respective voltage divided outputs are each within the allowable input voltage and common mode voltage range of a differential amplifier over an expected range of battery voltages, and
   a switching network connected to said dividers for selecting two measurement points to be presented for differential voltage measurement via said dividers,
   the divider ratios of said voltage dividers being closely matched so that said voltage divided outputs represent their respective measurement point voltages divided by approximately the same ratio.

15. The differential measurement circuit of claim 14, further comprising a differential amplifier having inputs connectable to two voltage divided outputs, for measuring the differential voltage between said voltage divided outputs.

16. The differential measurement circuit of claim 14, further comprising a battery comprised of a plurality of series-connected battery cells with the cathode of a first cell connected to said reference potential, wherein said measurement points are the anodes of respective battery cells.

17. The differential measurement circuit of claim 13, further comprising a differential amplifier having inputs connectable to two voltage divided outputs, for measuring the cell voltage of an individual battery cell.

18. The differential measurement circuit of claim 13, further comprising a switch between said reference potential and one input of said differential amplifier.

19. A method of measuring the differential voltage across a plurality of pairs of measurement points in which the voltage of some points are outside the allowable input range of a conventional differential amplifier, comprising the steps of:
   dividing down the voltage of each measurement point such that the ratio of the divided down voltage to its respective measurement point voltage is substantially equal for each measurement point, so that the resulting divided down voltages are each within the allowable input range of a conventional differential amplifier, said dividing down performed with voltage dividers which are each referenced to a common reference potential,
   multiplexing the divided down voltages to produce two outputs that are selectively connected to the divided down voltages of a respective pair of measurement points,
   measuring the differential voltage across said outputs, and
   multiplying the differential voltage measured across said divider outputs by the inverse of said ratio, producing a product that is about equal to the differential voltage between said respective measurement points.

20. The method of claim 19, wherein said dividing down is accomplished with precision voltage dividers, wherein the ratios of each of said dividers are matched to within ±100 parts per million.

21. The method of claim 19, wherein said pairs of measurement points are across individual cells in which said cells are series-connected to form a battery.

* * * * *